(12) United States Patent
Uppal et al.

(10) Patent No.: US 9,372,226 B2
(45) Date of Patent: Jun. 21, 2016

(54) WAFER TEST STRUCTURES AND METHODS OF PROVIDING WAFER TEST STRUCTURES

(71) Applicant: GLOBALFOUNDRIES Inc., Grand Cayman (KY)

(72) Inventors: Suresh Uppal, Clifton Park, NY (US); Randy W. Mann, Milton, NY (US); William McMahon, Scarsdale, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 27 days.

(21) Appl. No.: 14/337,290

(22) Filed: Jul. 22, 2014

(65) Prior Publication Data

US 2016/0025805 A1   Jan. 28, 2016

(51) Int. Cl.
| | |
|---|---|
| *G06F 17/00* | (2006.01) |
| *G01R 31/28* | (2006.01) |
| *H01L 23/525* | (2006.01) |
| *H01L 21/66* | (2006.01) |

(52) U.S. Cl.
CPC ............ *G01R 31/2884* (2013.01); *H01L 22/14* (2013.01); *H01L 22/34* (2013.01); *H01L 23/5256* (2013.01)

(58) Field of Classification Search
USPC ........................................................ 716/136
See application file for complete search history.

(56) References Cited

U.S. PATENT DOCUMENTS

| | | | | |
|---|---|---|---|---|
| 6,411,116 B1* | 6/2002 | DeHaven | ........... | G01R 1/07314 324/754.18 |
| 2002/0039802 A1* | 4/2002 | Ban | ...................... | G01R 31/2831 438/14 |
| 2003/0122550 A1* | 7/2003 | Kanamaru | ........... | G01R 1/0466 324/537 |
| 2008/0061817 A1* | 3/2008 | Erickson | ................. | G06F 21/76 326/8 |
| 2009/0109722 A1* | 4/2009 | Hsu | ........................ | G11C 17/18 365/96 |
| 2011/0169127 A1* | 7/2011 | Hsu | ...................... | H01L 23/5256 257/529 |
| 2013/0154099 A1* | 6/2013 | Hunter | .................... | H01L 24/03 257/762 |
| 2014/0003120 A1* | 1/2014 | Liao | ........................ | G11C 17/16 365/96 |
| 2014/0253220 A1* | 9/2014 | Kirihata | ................. | H01H 85/05 327/525 |

* cited by examiner

*Primary Examiner* — Mohammed Alam
(74) *Attorney, Agent, or Firm* — Heslin Rothenberg Farley and Mesiti PC; Nicholas Mesiti (57) ABSTRACT

Wafer test structures and methods of providing wafer test structures are described. The methods include: fabricating multiple test devices and multiple fuse devices on the wafer, each test device having a respective fuse device associated therewith, which open circuits upon failure of the test device; and fabricating a selection circuit operative to selectively connect one test device to a sense contact pad, and the other test devices to a stress contact pad. The selection circuit facilitates sensing one or more electrical signals of the one test device by electrical contact with the sense contact pad, while stress testing the other test devices by electrical contact with the stress contact pad. In one embodiment, each test device has respective first and second switch devices, operative to selectively electrically connect the test device to the sense or stress contact pads. In another embodiment, the method includes wafer testing using the test structure.

18 Claims, 3 Drawing Sheets

WAFER TEST STRUCTURES AND METHODS OF PROVIDING WAFER TEST STRUCTURES

FIELD OF THE INVENTION

The present invention relates to semiconductor devices and methods of fabricating semiconductor devices, and more particularly to wafer test structures and methods for providing wafer test structures and testing wafers.

BACKGROUND OF THE INVENTION

Integrated circuits are typically fabricated on semiconductor wafers, which are subsequently separated into individual dies and packaged as microchips, which are quality tested to assure satisfactory performance. Microchips that fail quality testing reduce yields and increase effective per microchip fabrication costs. Failure analysis may be performed in an effort to improve the fabrication process and increase yields, and testing during the fabrication process may facilitate failure analysis. However, testing time during fabrication also reduces overall yields.

BRIEF SUMMARY

The shortcomings of the prior art are overcome, and additional advantages are provided, through the provision, in one aspect, of a method which includes providing a test structure on a wafer. The providing includes: fabricating multiple test devices and multiple fuse devices on the wafer, each test device of the multiple test devices having a respective fuse device of the multiple fuse devices associated therewith, where the respective fuse device open circuits upon failure of the test device; and fabricating a selection circuit connected to a sense contact pad and a stress contact pad, the selection circuit being operative to selectively connect one test device of the multiple test devices to the sense contact pad, and concurrently therewith the other test devices of the multiple test devices to the stress contact pad, where the selection circuit facilitates sensing one or more electrical signals of the one test device by electrical contact with the sense contact pad, while stress testing the other test devices by electrical contact with the stress contact pad.

In another aspect, a structure is presented which includes a test structure provided on a wafer. The test structure includes: multiple test devices and multiple fuse devices disposed on the wafer, each test device of the multiple test devices having a respective fuse device of the multiple fuse devices associated therewith, where the respective fuse device open circuits upon failure of the test device; and a selection circuit connected to a sense contact pad and a stress contact pad, the selection circuit being operative to selectively connect one test device of the multiple test devices to the sense contact pad, and concurrently therewith the other test devices of the multiple test devices to the stress contact pad, where the selection circuit connects the one test device of the multiple test devices to the sense contact pad to facilitate sensing of one or more electrical signals thereof, and concurrently therewith, connects the other test devices of the multiple test devices to the stress contact pad to facilitate stress testing thereof.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

Generally stated, provided herein, in one aspect, is a structure. The structure includes multiple test devices and multiple fuse devices disposed on the wafer, each test device of the multiple test devices having a respective fuse device of the multiple fuse devices associated therewith, so that the respective fuse device open circuits upon failure of the test device; and a selection circuit connected to a sense contact pad and a stress contact pad, the selection circuit selectively connecting one test device of the multiple test devices to the sense contact pad, and concurrently therewith the other test devices of the multiple test devices to the stress contact pad, where the selection circuit connects the one test device of the multiple test devices to the sense contact pad to facilitate sensing of one or more electrical signals thereof, and concurrently therewith, connects the other test devices of the multiple test devices to the stress contact pad to facilitate stress testing thereof. In one implementation, the one test device may include a dielectric layer. In one specific example, the one test device may be a test transistor, the test transistor comprising a gate structure and a gate dielectric. In another specific example, the one test device may be a test capacitor, such as a metal-insulator-metal (MIM) capacitor. In another implementation, the wafer may include multiple dies, and the multiple test devices may be disposed within the multiple dies of the wafer to facilitate determining fabrication variability over the wafer. In a further implementation, the wafer may include at least one die, and the multiple test devices may be disposed over the at least one die of the wafer to facilitate determining fabrication variability within the at least one die of the wafer.

In one embodiment, the structure further includes multiple first switch devices and multiple second switch devices disposed on the wafer, each test device of the multiple test devices having a respective first switch device of the multiple first switch devices and a respective second switch device of the multiple second switch devices associated therewith, wherein the respective first switch device is operable to selectively electrically connect the test device to the sense contact pad and the respective second switch device is operative to selectively electrically connect the test device to the stress contact pad.

In another embodiment, the selection circuit is further configured to concurrently connect one or more electrical signals of one of the other test devices of the multiple test devices to the sense contact pad to facilitate sensing of one or more electrical signals thereof, and at least the one test device of the multiple test devices to the stress contact pad to facilitate stress testing thereof.

In a further embodiment, the structure further includes one or more integrated circuits disposed on the wafer, and the multiple test devices are interspersed among the one or more integrated circuits.

In another aspect, provided herein is a method for providing a test structure. The method includes providing a test structure on a wafer. The providing includes: fabricating multiple test devices and multiple fuse devices on the wafer, each test device of the multiple test devices having a respective fuse device of the multiple fuse devices associated therewith, where the respective fuse device open circuits upon failure of the test device; and fabricating a selection circuit connected to a sense contact pad and a stress contact pad, the selection circuit being operative to selectively connect one test device of the multiple test devices to the sense contact pad, and concurrently therewith the other test devices of the multiple test devices to the stress contact pad, where the selection circuit facilitates sensing one or more electrical signals of the one test device by electrical contact with the sense contact pad, while stress testing the other test devices by electrical contact with the stress contact pad. In such a case, the providing may further include fabricating one or more integrated circuits on the wafer, the multiple test devices being interspersed among the one or more integrated circuits.

In one embodiment, fabricating includes: fabricating multiple first switch devices and multiple second switch devices on the wafer, each test device of the multiple test devices having a respective first switch device of the multiple first switch devices and a respective second switch device of the multiple second switch devices associated therewith, where the respective first switch device is operative to selectively electrically connect the test device to the sense contact pad and the respective second switch device is operative to selectively electrically connect the test device to the stress contact pad. In another embodiment, the one test device comprises a dielectric layer, and the respective fuse device associated with the one test device open circuits upon a breakdown of the dielectric layer thereof. In such a case, the one test device may be a test transistor, and the dielectric layer may be a gate dielectric layer of the one test transistor. In a further embodiment, fabricating includes: fabricating the multiple test devices comprises fabricating the multiple test devices within multiple dies of the wafer to facilitate determining fabrication variability of the wafer using electrical responses of the multiple test devices of the multiple dies.

In one implementation, the method further includes testing the wafer, and the testing includes: sensing one or more electrical signals of the one test device of the multiple test devices by electrical contact with the sense contact pad; and stress testing the other test devices by electrical contact with the stress contact pad. In such an implementation, the stress testing may include applying a voltage to the stress contact pad to cause a failure of at least one test device of the multiple test devices, wherein the at least one fuse device associated therewith open circuits to electrically isolate the at least one test device. By way of example, the failure may include establishment of a new conductive path from the at least one test device to an electrical ground.

In another implementation, the method further includes sensing one or more electrical signals of one of the other test devices of the multiple test devices by electrical contact with the sense contact pad, and stress testing at least the one test device of the multiple test devices by electrical contact with the stress contact pad. In a further implementation, the sensing comprises identifying a failure of the one test device of the multiple test devices.

In one example, the sensing comprises detecting a current flowing between the sense contact pad and the one test device to determine a change in an electrical property of the one test device. In another example, testing the wafer further includes heating the one test device to facilitate failure thereof. In a further example, the sensing includes applying a sense voltage to the one test device, before the failure thereof, and measuring an electrical leakage current through the at least one test device.

In one embodiment, the method further includes determining a mean time to failure of the one test device from the one or more electrical signals thereof. In another embodiment, the method further includes determining fabrication variability of the wafer using electrical responses of the multiple test devices of the multiple dies.

Reference is made below to the drawings, which are not drawn to scale for ease of understanding, wherein the same reference numbers used throughout different figures designate the same or similar components.

Figure 1A:
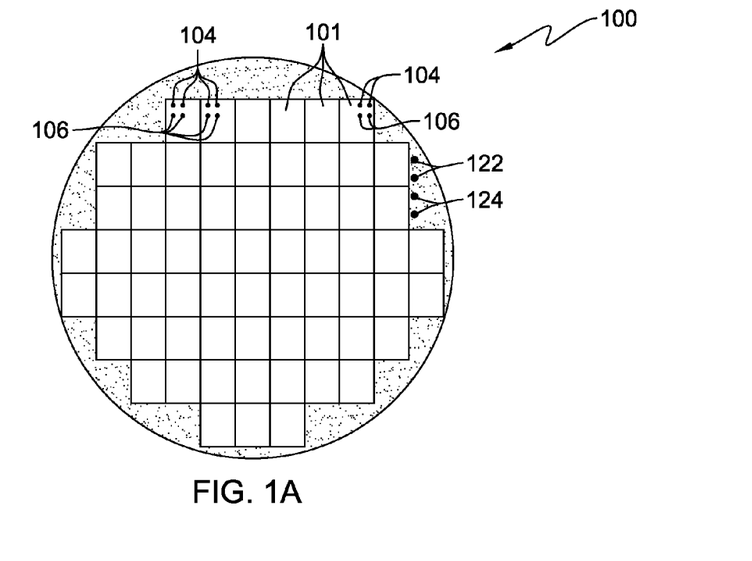
FIG. 1A depicts a wafer, in accordance with one or more aspects of the present invention.

FIG. 1A depicts a wafer 100, in accordance with one or more aspects of the present invention. By way of overall context, in one embodiment, during semiconductor fabrication processing, integrated circuits are formed on wafer 100, including within multiple dies 101. In a later phase of fabrication processing, wafer 100 can be cut apart to separate the dies for packaging as individual microchips. To facilitate testing of the integrated circuits, a test structure may be provided on wafer 100 during the fabrication process. In the illustrated embodiment, the test structure includes multiple test devices 104 and multiple fuse devices 106 disposed on wafer 100. In order to conduct tests, an external test system may be connected to a sense contact pad(s) 122 and a stress contact pad(s) 124 also provided on wafer 100. The external test system enables stress testing of test devices 104, and sensing one or more electrical signals of test devices 104, as well as facilitating analysis of the results to determine various characteristics of the test devices during the testing.

One of the goals of the testing described herein is to analyze the performance of devices created using the same fabrication process as the test devices. For instance, by performing stress testing on the test devices, using currents and voltages that are beyond the rated operational ranges for the integrated circuits, it is possible to simulate how the test devices would behave over extended periods of time, such as periods with a greater duration than the test duration. Because such testing may be destructive, sacrificial test devices may be used to perform such testing, and results for the test devices will be strongly correlated with results for devices of the integrated circuits.

For example, in one embodiment, the test devices are interspersed among the one or more integrated circuits on the wafer, and formed using the same fabrication processing steps as used to form the one or more integrated circuits. Therefore, the test devices closely represent the behavior of actual devices of the integrated circuits. To represent a variety of actual devices, the different test devices may have the same or different characteristics. In one example, different gate lengths, gate widths, gate areas, dielectric thicknesses, materials choices, top and bottom electrodes, substrate types (e.g., bulk or on insulator) or device types, such as capacitors, fuses, may be used for test devices on different portions of wafer 100.

Another of the goals of the testing is to analyze the fabrication processing techniques themselves, and in particular, the variation in the process within a die and within a wafer. For instance, by sensing the different test devices within the multiple dies of the wafer, and comparing the results for the different sensed test devices, fabrication variability over the wafer may be determined. The results of such testing may be used to determine one or more root causes of the performance variability, and may be critical in the research and development phase.

Microchips, which include integrated circuits, may be rated in terms of their usable lifespan before failure. One key failure mechanism or mode of a semiconductor device is time dependent dielectric breakdown (TDDB). In TDDB, a dielectric of a device, such as a gate dielectric layer of a transistor, or a dielectric layer of a capacitor, is damaged due to normal long term use, including application of an electric field over the dielectric layer during device operation. TDDB may occur after weeks, months, or years of use of the device. In order to ensure that manufactured devices will not break down before their rated lifespan, accelerated testing methodologies may be used, in which test devices are exposed to precisely controlled, but abnormally stressful, conditions to deliberately cause failure of the devices. By modeling the relationship between the stressful conditions, normal operating conditions, device parameters, and other statistical model parameters, the time to failure of the devices under normal operating conditions may be predicted.

During fabrication processing, the test structures may be completed and ready to test at an early stage. For example, the test structures may be created during front-end of line (FEOL) processing. The wafer may be tested at the completion of FEOL processing, and before BEOL processing. Advantageously, early test results obtained before the wafer is fully fabricated may allow for tuning of processes, quicker time to discovery of fabrication faults, etc.

The fabrication processing disclosed herein may include numerous steps in which materials may be introduced onto or within the wafer, using for example, chemical vapor deposition, atomic layer deposition, epitaxial growth, oxidation treatment, etc. For instance, the wafer may be patterned and etched, and the wafer may be exposed to various processing treatments, such as photolithographic patterning, isotropic or anisotropic etching, plasma treatment, annealing (including spike annealing), etc. Fabrication processing may include front-end of line (FEOL) processing, in which individual devices are created, including, for example, metal-oxide-semiconductor field-effect transistors (MOSFETs), as well as capacitors, resistors, and other semiconductor devices. Such devices may be planar, or may be three dimensional, for example including a fin structure extending from the semiconductor substrate upon which the channel, source, and/or drain may be formed. These devices may be formed using various techniques, and their formation may include several steps of processing such as depositing or growing materials to create surface structures, isolating devices with shallow or deep trenches that are filled with isolation materials, forming n-type and p-type wells by doping one or more portions, providing gate structures, establishing source and drain structures, etc.

In one example, the wafer may be or include any silicon-containing substrate material including, but not limited to, single crystal Si, polycrystalline Si, amorphous Si, Si-on-nothing (SON), Si-on-insulator (SOI), or Si-on-replacement insulator (SRI) substrates. In other examples, the wafer may be or include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof or an alloy semiconductor including GaAsP, AlInAs, GaInAs, GaInP, or GaInAsP or combinations thereof.

Figure 1B:
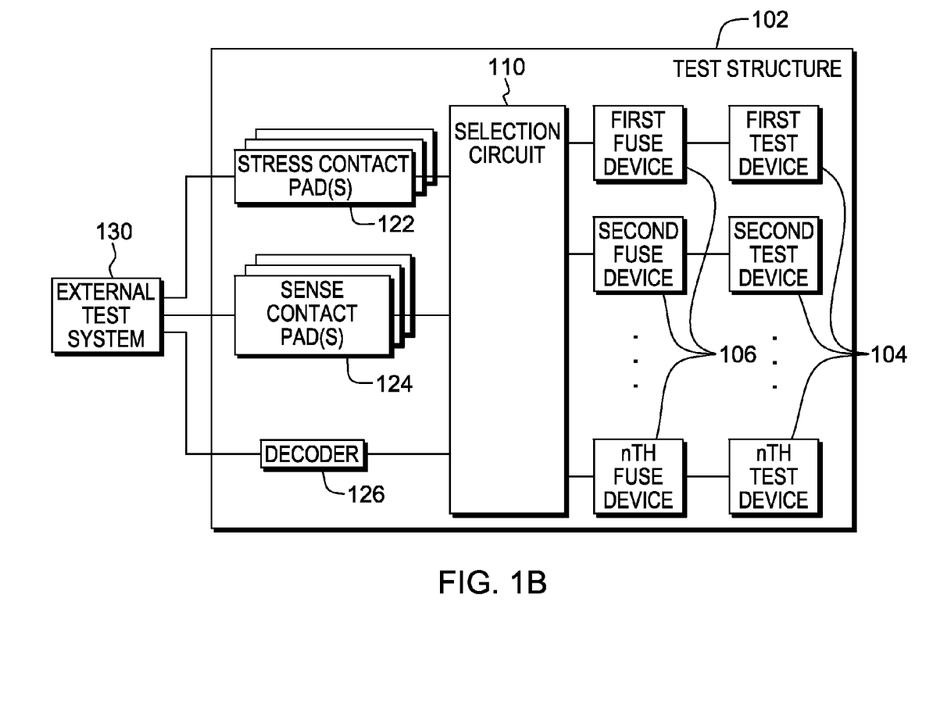
FIG. 1B is a block diagram of a test structure provided on a wafer, in accordance with one or more aspects of the present invention.

FIG. 1B is a block diagram of a test structure 102 provided on a wafer, in accordance with one or more aspects of the present invention. As illustrated, test structure 102 includes multiple test devices 104 and multiple fuse devices 106. Each test device 104 has a respective fuse device 106 associated therewith. In one embodiment, fuse device 106 is designed to open circuit upon failure of test device 104.

In the illustrated embodiment, a selection circuit 110 is connected to a stress contact pad(s) 122 and a sense contact pad(s) 124. Selection circuit 110 selectively connects one test device to sense contact pad 124, to facilitate sensing of one or more electrical signals. Sensing the electrical signals may include sensing or measuring the current, voltage, or a phase or rate of change thereof. Decoder 126 may be used, as described below, in the selective connectivity.

In one embodiment, a voltage is applied by an external test system 130 at the sense contact pad, and the current flowing to the one test device is sensed or measured. In such an embodiment, selection circuit 110 may also selectively connects the other test devices to stress contact pad 122, to facilitate stress testing thereof by external test system 130. For example, connection of the one test device to the sense contact pad and the other test devices to the stress contact pad may be concurrent.

During the stress testing, in one embodiment, a variable voltage is applied at the stress contact pad, and ramped between a first voltage (or current) level and a second voltage (or current) level which exceeds the rated capacity of the test device. In another embodiment, different constant voltage (or current) levels are applied to different test devices for different durations. During a test cycle, test devices may be heated to facilitate failure, and the temperature characteristics may be collected by external test system 130.

In one example, test device 104 may fail during testing. For instance, due to the applied stress voltage (or current), establishment of a new conductive path from the test device to an electrical ground may take place. This could occur due to dielectric breakdown. In such a case, in one embodiment, test device 104 would offer a low resistance path to ground, and would draw a large current, causing fuse device 106 to open circuit to electrically isolate test device 104.

Advantageously, the stress testing of the other test devices may proceed without regard for the failed test device, because it has been electrically isolated from the test structure. This allows numerous test devices to be simultaneously stressed, rather than tested one at a time, reducing the amount of time needed to test a large number of test devices on a wafer. In addition, simultaneous testing, as described herein, eliminates delays in sensing test devices, improving the accuracy of testing, reducing dependencies on the physics of trapping/de-trapping, etc.

In another embodiment, groups of test devices 104 may be simultaneously subjected to different testing protocols through the use of multiple test contact pads and multiple stress contact pads. For example, external test system 130 may use a first pair or stress and sense contact pads to test a first group of test devices, a second pair of stress and sense contact pads to test a second group of test devices, and so on.

External test system 130 may collect a variety of information during the course of the testing described herein. For example, external test system 130 may cycle through sensing test devices during testing of other test devices. Sensing may include detection of a change in the voltage/current response of electrical signals sensed from a test device, indicating changes in a test device during stress testing, which may be characterized as a partial failure of the test device. Sensing may also include sensing an open circuit of a fuse device, indicating complete failure of a test device. Various device parameters, including leakage current, turn on voltage, etc., may be determined.

In one embodiment, external test system 130 may include one or more probes or connectors that connect to contact pads and/or a decoder of the test structure. For instance, external test system 130 may include one or more electrical signal generators capable of generating electrical signals and pulses to the contact pads of the test structure, and one or more electrical measurement devices for sensing electrical signals, such as voltages and currents, from the contact pads. External test system 130 may also include one or more processors or controllers for executing control software to automate stressing and sensing of the test structure, collection of test results, and analysis thereof. In one example, external test system 130 may be a semiconductor parameter analyzer, and may include signal generators, power supplies, and other equipment for generating voltages and currents needed for the testing described herein.

By way of example, external test system 130 may include a test program, or macro. The test program may use the selection circuit to selectively connect one test device to the sense contact pad, and an electrical measurement device of the external test system may sense one or more electrical signals of the one test device at the sense contact pad. Concurrently, the test program may use the selection circuit to selectively connect the other test devices to the stress contact pad, and an electrical signal generator of the external test system may apply electrical signals to the other test devices at the stress contact pad. In such a case, after, for example, a period of time or detection of a failure of a test device, or some other condition, the test program may be programmed to use the selection circuit to selectively connect a different test device to the stress contact pad, and concurrently use the selection circuit to selectively connect the test devices (except for the different test device) to the stress contact pad. In such a manner, the test program may cycle through sensing each of the test devices and stressing the rest of the test devices.

In one embodiment, external test system 130 includes statistical modeling software that uses the results of testing to predict, or model, various characteristics of the test devices, including fabrication variability across the wafer and within dies. For example, external test system 130 may include a computer system with a graphical user interface for displaying a map of the wafer showing performance of the test devices in different regions of the wafer. Such information may be used to assess the uniformity or and performance of various fabrication processes.

Figure 1C:
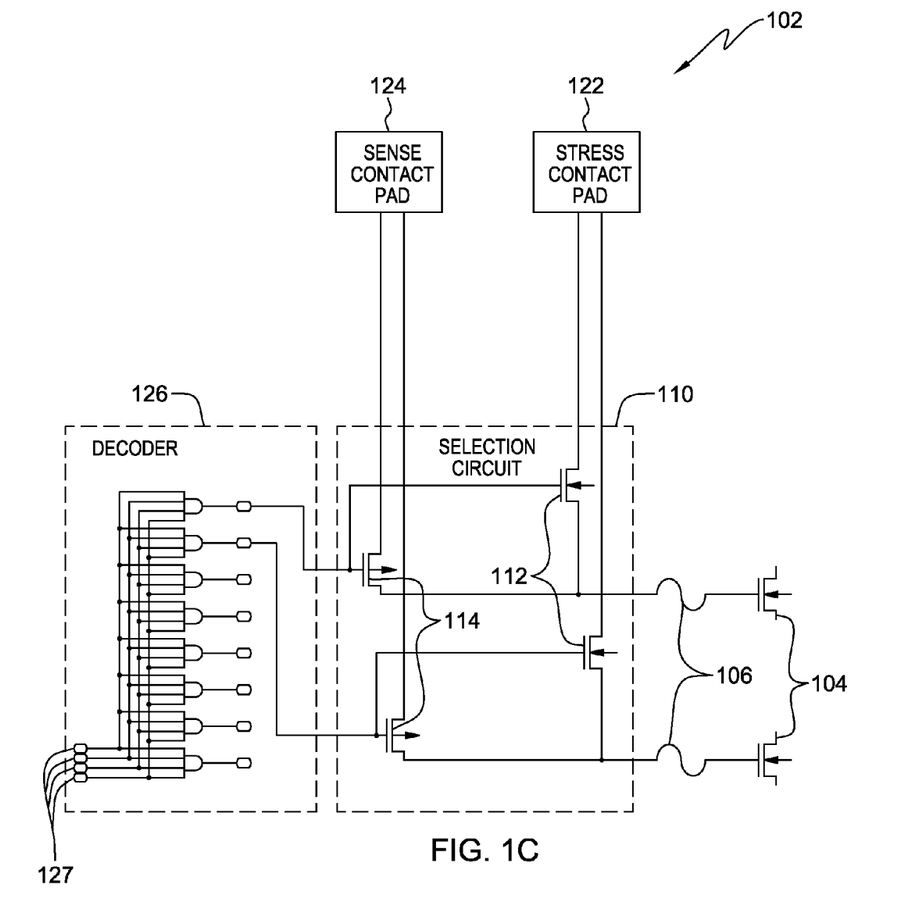
FIG. 1C is a circuit diagram of one embodiment of the test structure of FIG. 1B, in accordance with one or more aspects of the present invention.

FIG. 1C is a circuit diagram of one embodiment of a test structure 102, in accordance with one or more aspects of the present invention. In the illustrated embodiment, test structure 102 includes a selection circuit 110 with multiple switch devices 112, 114. Each test device 104 has a respective first switch device 112 and a respective second switch device 114 associated therewith. The first switch devices and second switch devices are of opposite polarities, so that a common applied voltage to both switch devices will turn one on and one off. This allows the first switch device 112 to selectively electrically connect test device 104 to a sense contact pad 124 and the second switch device 114 to selectively electrically connect test device 104 to a stress contact pad 122, depending on, for example, the polarity of the voltage applied to switch devices 112, 114. As illustrated, in one example, first switch devices 112 may be p-type field effect transistors (PFETs) and second switch devices 114 may be n-type field effect transistors (NFETs).

In the illustrated embodiment, a decoder 126 is provided to allow selective connectivity of various configurations of the multiple test devices and the contact pads. Decoder 126 includes address lines 127. In an embodiment with n address lines, a total of $2^n$ test devices may be selectively connected. For example, in various embodiments, 4, 6, 8, 10, or more address lines may be provided, allowing selective connectivity of 16, 64, 256, 1024, or more provided test devices to the contact pads. In operation, address lines 127 may be configured to select a specific test device to be connected to the sense contact pad, and select the other test devices to be connected to the stress contact pad. This is achieved because a voltage level corresponding to a logical one may be applied to the first and second switch device associated with the specific test device, thereby turning on the first switch device associated with the specific test device and connecting it to the sense contact pad, and turning off the second switch device associated with the specific test device and breaking the conductive path to the stress contact pad. The selection circuit and decoder may be configured such that a voltage level corresponding to a logical zero is applied to all other switch devices, thereby connecting all other switch devices to the stress contact pad only.

By way of example, an external test system (as discussed with reference to FIG. 1B), may interface with the test structure and identify the test devices by a binary number corresponding to the possible settings of decoder 126. In the illustrated embodiment, decoder 126 has 8 address lines 127, and therefore may address $2^8$, or 256, different test devices, for selective connection. In such a case, each test device corresponds to a number ranging from 0 to 255. Advantageously, use of decoder 126 facilitates an external test system concurrently sensing and/or stress testing all 256 test devices, in the illustrated embodiment. For example, decoder 126 allows sequential sensing of one test device at a time, concurrent with all other test devices being under stress.

Fuse devices 106 may be, for example, so-called e-fuse devices. In an embodiment, fuse devices 106 may include a silicide layer, formed by silicidation of silicon. In such an example, when a large amount of current flows, metal reflow may occur due to resistive heat generated in the fuse device, leading to a break in the silicide layer, and the fuse device open circuits (or, stated colloquially, the fuse device is "blown.") In another example, fuse device 106 may include a metal that is sensitive to electro-migration, such that when the stress testing causes the associated test device to fail, the fuse device open circuits. Fuse devices may be implemented using a variety of techniques. For example, fuses devices may include partial or full silicidation or metallization, and be designed such that it becomes an open circuit when an appropriate current flows through the test device, as described below. In one specific example, a fuse design may take advantage of enhanced Joule heating by leveraging thermal isolation near the fuse device. Such a fuse device open circuits when electro-migration of the fuse link takes place from the anode to the cathode, with the silicide moving.

Because the fuse device may be formed during the fabrication process described herein, the specific parameters, e.g., the current rating at which the fuse device open circuits, may be tuned to match the parameters of the test devices. For example, some fuse devices may have a current rating that matches the current drawn by a test device in the failed state. In such an example, the fuse device associated with the test device will open circuit concurrently with the failure of the test device, allowing for statistics regarding the exact time to failure of the test device.

Figure 2:
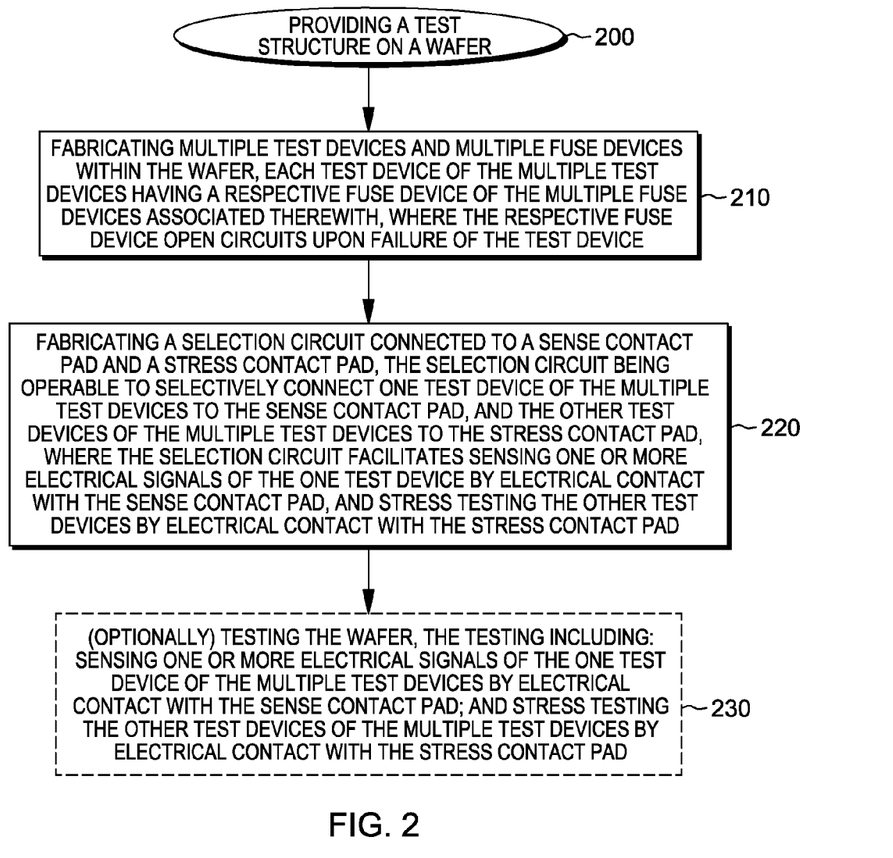
FIG. 2 depicts an embodiment of a process for providing a test structure on a wafer, in accordance with one or more aspects of the present invention.

By way of summary, FIG. 2 depicts an embodiment of a process for providing a test structure, in accordance with one or more aspects of the present invention. The method includes providing a test structure on a wafer 200. The providing includes: fabricating multiple test devices and multiple fuse devices on the wafer, each test device of the multiple test devices having a respective fuse device of the multiple fuse devices associated therewith, where the respective fuse device open circuits upon failure of the test device 210; and fabricating a selection circuit connected to a sense contact pad and a stress contact pad, the selection circuit being operative to selectively connect one test device of the multiple test devices to the sense contact pad, and concurrently therewith the other test devices of the multiple test devices to the stress contact pad, where the selection circuit facilitates sensing one or more electrical signals of the one test device by electrical contact with the sense contact pad, while stress testing the other test devices by electrical contact with the stress contact pad 220. In such a case, the providing 200 may further include fabricating one or more integrated circuits on the wafer, the multiple test devices being interspersed among the one or more integrated circuits.

In one embodiment, fabricating 220 includes: fabricating multiple first switch devices and multiple second switch devices on the wafer, each test device of the multiple test devices having a respective first switch device of the multiple first switch devices and a respective second switch device of the multiple second switch devices associated therewith, where the respective first switch device is operative to selectively electrically connect the test device to the sense contact pad and the respective second switch device is operative to selectively electrically connect the test device to the stress contact pad. In another embodiment, the one test device comprises a dielectric, and the respective fuse device associated with the one test device open circuits upon a breakdown of the dielectric layer thereof. In a further embodiment, fabricating 210 includes: fabricating the multiple test devices comprises fabricating the multiple test devices within multiple dies of the wafer to facilitate determining fabrication variability of the wafer using electrical responses of the multiple test devices of the multiple dies.

In one implementation, the method further includes testing the wafer 230, and the testing includes: sensing one or more electrical signals of the one test device of the multiple test devices by electrical contact with the sense contact pad; and stress testing the other test devices by electrical contact with the stress contact pad. In such an implementation, the stress testing may include applying a voltage to the stress contact pad to cause a failure of at least one test device of the multiple test devices, wherein the at least one fuse device associated therewith open circuits to electrically isolate the at least one test device. By way of example, the failure may include establishment of a new conductive path from the at least one test device to an electrical ground.

In another implementation, the method further includes sensing one or more electrical signals of one of the other test devices of the multiple test devices by electrical contact with the sense contact pad, and stress testing at least the one test device of the multiple test devices by electrical contact with the stress contact pad. In a further implementation, the sensing comprises identifying a failure of the one test device of the multiple test devices.

In one example, the sensing comprises detecting a current flowing between the sense contact pad and the one test device to determine a change in an electrical property of the one test device. In another example, testing the wafer further includes heating the one test device to facilitate failure thereof. In a further example, the sensing includes applying a sense voltage to the one test device, before the failure thereof, and measuring an electrical leakage current through the at least one test device.

In one embodiment, the method further includes determining a mean time to failure of the one test device from the one or more electrical signals thereof. In another embodiment, the method further includes determining fabrication variability of the wafer using electrical responses of the multiple test devices of the multiple dies.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

The invention claimed is:

1. A method comprising:
   providing a test structure on a wafer, the providing comprising:
      fabricating multiple test devices and multiple fuse devices on the wafer, each test device of the multiple test devices having a respective fuse device of the multiple fuse devices associated therewith, wherein the respective fuse device forms an open circuit upon failure of the test device; and
      fabricating a selection circuit connected to a sense contact pad and a stress contact pad, the selection circuit being operative to selectively connect one test device of the multiple test devices to the sense contact pad, and concurrent therewith the other test devices of the multiple test devices to the stress contact pad, wherein the selection circuit facilitates sensing one or more electrical signals of the one test device by electrical contact with the sense contact pad, while stress testing the other test devices by electrical contact with the stress contact pad, wherein fabricating the selection circuit comprises:
         fabricating multiple first switch devices and multiple second switch devices on the wafer, each test device of the multiple test devices having a respective first switch device of the multiple first switch devices and a respective second switch device of the multiple second switch devices associated therewith, wherein the respective first switch device is operative to selectively electrically connect the test device to the sense contact pad and the respective second switch device is operative to selectively electrically connect the test device to the stress contact pad.

2. The method of claim 1, wherein the one test device comprises a dielectric layer, and the respective fuse device associated with the one test device open circuits upon a breakdown of the dielectric layer thereof.

3. The method of claim 1, wherein fabricating the multiple test devices comprises fabricating the multiple test devices within multiple dies of the wafer to facilitate determining fabrication variability of the wafer using electrical responses of the multiple test devices of the multiple dies.

4. The method of claim 1, wherein the providing further comprises fabricating one or more integrated circuits on the wafer, the multiple test devices being interspersed among the one or more integrated circuits.

5. The method of claim 1, further comprising:
   testing the wafer, the testing comprising:
      sensing one or more electrical signals of the one test device of the multiple test devices by electrical contact with the sense contact pad; and
      stress testing the other test devices by electrical contact with the stress contact pad.

6. The method of claim 5, wherein the stress testing comprises applying a voltage to the stress contact pad to cause a failure of at least one test device of the multiple test devices, wherein the at least one fuse device associated therewith open circuits to electrically isolate the at least one test device.

7. The method of claim 6, wherein the failure comprises establishment of a new conductive path from the at least one test device to an electrical ground.

8. The method of claim 5, further comprising sensing one or more electrical signals of one of the other test devices of the multiple test devices by electrical contact with the sense contact pad, and stress testing at least the one test device of the multiple test devices by electrical contact with the stress contact pad.

9. The method of claim 5, wherein the sensing comprises identifying a failure of the one test device of the multiple test devices.

10. The method of claim 5, wherein the sensing comprises detecting a current flowing between the sense contact pad and the one test device to determine a change in an electrical property of the one test device.

11. The method of claim 5, wherein testing the wafer further comprises heating the one test device to facilitate failure thereof.

12. The method of claim 1, wherein the sensing comprises applying a sense voltage to the one test device, before the failure thereof; and measuring an electrical leakage current through the one test device.

13. The method of claim 5, further comprising determining a mean time to failure of the one test device from the one or more electrical signals thereof.

14. The method of claim 5, further comprising determining fabrication variability of the wafer using electrical responses of the multiple test devices of the multiple dies.

15. A structure comprising:
   a test structure provided on a wafer, the test structure comprising:
      multiple test devices and multiple fuse devices disposed on the wafer, each test device of the multiple test devices having a respective fuse device of the multiple fuse devices associated therewith, wherein the respective fuse device forms an open circuit upon failure of the test device;
      a selection circuit connected to a sense contact pad and a stress contact pad, the selection circuit being operative to selectively connect one test device of the multiple test devices to the sense contact pad, and concurrent therewith the other test devices of the multiple test devices to the stress contact pad, wherein the selection circuit connects the one test device of the multiple test devices to the sense contact pad to facilitate sensing of one or more electrical signals thereof, and concurrently therewith, connects the other test devices of the multiple test devices to the stress contact pad to facilitate stress testing thereof; and
      multiple first switch devices and multiple second switch devices disposed on the wafer, each test device of the multiple test devices having a respective first switch device of the multiple first switch devices and a respective second switch device of the multiple second switch devices associated therewith, wherein the respective first switch device selectively electrically connects the test device to the sense contact pad and the respective second switch device selectively electrically connects the test device to the stress contact pad.

16. The structure of claim 15, wherein the selection circuit is further configured to concurrently connect one or more electrical signals of one of the other test devices of the multiple test devices to the sense contact pad to facilitate sensing of one or more electrical signals thereof, and at least the one test device of the multiple test devices to the stress contact pad to facilitate stress testing thereof.

17. The structure of claim 15, wherein the wafer comprises multiple dies, and the multiple test devices are disposed within the multiple dies of the wafer to facilitate determining fabrication variability over the wafer.

18. The structure of claim 15, further comprising one or more integrated circuits disposed on the wafer, wherein the multiple test devices are interspersed among the one or more integrated circuits.

\* \* \* \* \*